(12) United States Patent
Lee (10) Patent No.: US 9,747,993 B2
(45) Date of Patent: Aug. 29, 2017

(54) MEMORY SYSTEMS (71) Applicant: EMPIRE TECHNOLOGY DEVELOPMENT LLC, Wilmington, DE (US)

(72) Inventor: Hyoung-Gon Lee, Gapyeong-gun (KR)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/908,340

(22) PCT Filed: Aug. 13, 2013

(86) PCT No.: PCT/US2013/054672
§ 371 (c)(1),
(2) Date: Jan. 28, 2016

(87) PCT Pub. No.: WO2015/023259
PCT Pub. Date: Feb. 19, 2015

(65) Prior Publication Data
US 2016/0211033 A1  Jul. 21, 2016

(51) Int. Cl.
*G11C 16/26* (2006.01)
*G11C 16/16* (2006.01)
(Continued)

(52) U.S. Cl.
CPC ........ *G11C 16/3431* (2013.01); *G06F 3/0608* (2013.01); *G06F 3/0652* (2013.01);
(Continued)

(58) Field of Classification Search
CPC . G11C 16/26; G11C 16/3427; G11C 16/3418; G11C 16/3407; G11C 11/5642; G11C 16/3431
(Continued)

(56) References Cited

U.S. PATENT DOCUMENTS 6,657,898 B2   12/2003   Hirano
7,706,182 B2    4/2010   Shalvi et al.
(Continued)

FOREIGN PATENT DOCUMENTS

TW   I375953 B   11/2012
TW   I375962 B   11/2012

OTHER PUBLICATIONS

"SSD Raid array: What it is and how to use it", accessed at http://web.archive.org/web/20130313085553/http://www.computerweekly.com/podcast/SSD-RAID-array-What-it-is-and-how-to-use-it, accessed on Jan. 19, 2016, pp. 13 (Wayback Machine date: May 13, 2013).
(Continued)

*Primary Examiner* — Ly D Pham
(74) *Attorney, Agent, or Firm* — Brundidge & Stanger, P.C.

(57) ABSTRACT

Technologies are generally described for a memory system that may be a solid-state drive (SDD). The memory system may include memory blocks, where each memory block may have multiple memory pages, and each memory page may have multiple memory cells. The memory cells may have multiple programmed states. In various examples, a method to control the memory system may include determining one or more memory pages to be analyzed, identifying read threshold voltages of each memory cell associated with the memory pages to be analyzed, performing statistical analysis on the identified read threshold voltages, and determining a distribution of the read threshold voltages based at least in part on the statistical analysis.

13 Claims, 5 Drawing Sheets

(51) Int. Cl.

| | |
|---|---|
| *G11C 16/34* | (2006.01) |
| *G11C 29/02* | (2006.01) |
| *G11C 29/42* | (2006.01) |
| *G11C 29/44* | (2006.01) |
| *G11C 29/50* | (2006.01) |
| *G06F 3/06* | (2006.01) |
| *G11C 16/14* | (2006.01) |

(52) U.S. Cl.
CPC .......... *G06F 3/0653* (2013.01); *G06F 3/0679* (2013.01); *G11C 16/14* (2013.01); *G11C 16/349* (2013.01); *G11C 29/021* (2013.01); *G11C 29/028* (2013.01); *G11C 29/42* (2013.01); *G11C 29/44* (2013.01); *G11C 29/50* (2013.01)

(58) Field of Classification Search
USPC .......................................... 365/185.02, 185.24
See application file for complete search history.

(56) References Cited

U.S. PATENT DOCUMENTS

| | | | |
|---|---|---|---|
| 7,818,525 | B1 | 10/2010 | Frost et al. |
| 8,332,576 | B2 | 12/2012 | Chu et al. |
| 8,369,141 | B2 | 2/2013 | Sommer et al. |
| 8,621,139 | B2 | 12/2013 | Chu |
| 2005/0013165 | A1 | 1/2005 | Ban |
| 2008/0239820 | A1 | 10/2008 | Wang |
| 2008/0288814 | A1 | 11/2008 | Kitahara |
| 2011/0066793 | A1 | 3/2011 | Burd |
| 2011/0096612 | A1* | 4/2011 | Steiner ................ G11C 11/5642 365/189.09 |
| 2011/0161775 | A1 | 6/2011 | Weingarten |
| 2012/0079318 | A1 | 3/2012 | Colgrove et al. |
| 2012/0151294 | A1 | 6/2012 | Yoo et al. |
| 2012/0236655 | A1 | 9/2012 | Yang |
| 2013/0051143 | A1* | 2/2013 | Shen .................... G06F 11/1048 365/185.09 |
| 2014/0136883 | A1* | 5/2014 | Cohen ................ G06F 11/2094 714/6.11 |
| 2014/0136884 | A1* | 5/2014 | Werner ............... G06F 11/2094 714/6.11 |
| 2014/0281121 | A1* | 9/2014 | Karamcheti ........ G06F 12/0246 711/102 |
| 2015/0331806 | A1* | 11/2015 | Mondal ............... G06F 12/0246 711/103 |

OTHER PUBLICATIONS

Claypool, M., and Claypool, K, "Latency Can Kill: Precision and Deadline in Online Games," Proceedings of the =first ACM Multimedia Systems Conference (MMSys), pp. 215-222 (Feb. 22-23, 2010).

International Search Report and Written Opinion for International Application No. PCT/US2013/054672 mailed on May 29, 2014.

Park, K.T., et al., "A Zeroing Cell-to-Cell Interference Page Architecture With Temporary LSB Storing and Parallel VISB Program Scheme for MLC NAND Flash Memories," IEEE Journal of Solid-State Circuits, vol. 43, No. 4, pp. 919-928 (Apr. 2008).

Soljanin, E, et al., "Incremental Redundancy Hybrid ARQ with LDPC and Raptor Codes," Submitted to the IEEE Transactions on Information Theory, pp. 1-37 (Sep. 2005).

\* cited by examiner

MEMORY SYSTEMS

CROSS-REFERENCE TO RELATED APPLICATION

This Application is the U.S. National Stage filing under 35 U.S.C. §371 of International Application No. PCT/US2013/054672, filed on Aug. 13, 2013. The disclosure of the International Application is hereby incorporated herein by reference in its entirety.

BACKGROUND

Unless otherwise indicated herein, the approaches described in this section are not prior art to the claims in this application and are not admitted to be prior art by inclusion in this section.

A solid-state drive (SSD) can generally be described as a data storage device using integrated circuit assemblies. Although early SSDs used volatile memories such as dynamic random-access memories (DRAMs), modern SSDs are increasingly using non-volatile NAND flash due to the lower cost compared with DRAMs.

A multi-level cell (MLC) can generally be described as a memory element capable of storing more than a single bit of information. An example MLC NAND flash has multiple voltage levels/states per cell to allow multiple bits to be stored using the same number of transistors as in a single-level cell (SLC) NAND flash. For example, in an MLC NAND flash capable of storing two bits of information per cell, four voltage levels/states (e.g., V0 for "00", V1 for "01", V2 for "11" and V3 for "10") are used to store desired data.

SUMMARY

Technologies described herein generally relate to control in memory systems.

Various example memory systems described herein may include memory blocks. Each memory block may have memory pages, and each memory page may have memory cells. In some examples, a method to control a memory system may include determining one or more memory pages to be analyzed, identifying read threshold voltages of each memory cell associated with the memory pages to be analyzed, performing statistical analysis on the identified read threshold voltages, and determining a distribution of the read threshold voltages based at least in part on the statistical analysis.

In some examples, methods to control a memory system are described. Example methods may include invalidating each memory page of each selected memory block of the memory system, identifying read threshold voltages associated with each memory cell of each memory page of each selected memory block, storing the identified read threshold voltages of each memory cell in a predetermined memory portion of the memory system, erasing each selected memory block, and determining a distribution of the read threshold voltages associated with the memory system.

In various examples, a memory system may include a plurality of memory blocks associated with the memory system and memory controller coupled to the plurality of memory blocks. The memory controller may be configured to identify one or more memory blocks to be erased, identify read threshold voltages of each memory cell of each memory page of each identified memory block, perform statistical analysis on the identified read threshold voltages to determine a distribution of read threshold voltages, and decode data stored in the plurality of memory blocks based at least in part on the determined distribution of read threshold voltages.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, may be arranged, substituted, combined, separated, and designed in a wide variety of different configurations, all of which are explicitly contemplated herein.

This disclosure is generally drawn, inter alia, to methods, apparatus, systems, devices and/or computer program products related to control of a memory system that includes a memory array.

Briefly stated, technologies are generally described for a memory system that may be a solid-state drive (SDD). The memory system may include multiple memory blocks, where each memory block may have multiple memory pages, and each memory page may have multiple memory cells. The memory cells may have multiple programmed states.

In various examples, the memory system may be configured to store data by writing or programming the data into one or more memory cells. For example, the memory controller may be configured to convert the data to analog storage values, and write the analog storage values into the one or more memory cells. When retrieving the data from the memory cells, the memory controller may be configured to convert the analog storage values into digital values based on read threshold voltages of the memory cells. The read threshold voltages of the memory cells may be adapted to distinguish the multiple programmed states from one another. The read threshold voltages may be affected by various factors. Example factors may include wear-out of the memory cells, power condition of the memory system, read/write disturb (e.g., errors caused due to read and write activities in adjacent cells or pages), and so on.

In some embodiments, the memory controller may be configured to dynamically change the read threshold voltages. In some example embodiments, the memory controller may be adapted to identify the read threshold voltages of each memory cell of each memory page of each memory blocks to be erased, and also adapted to perform statistical analysis on the identified read threshold voltages to determine a distribution of read threshold voltages. Then, the memory controller may be configured to decode the data stored in the memory blocks based at least in part on the determined distribution of read threshold voltages.

Figure 1:
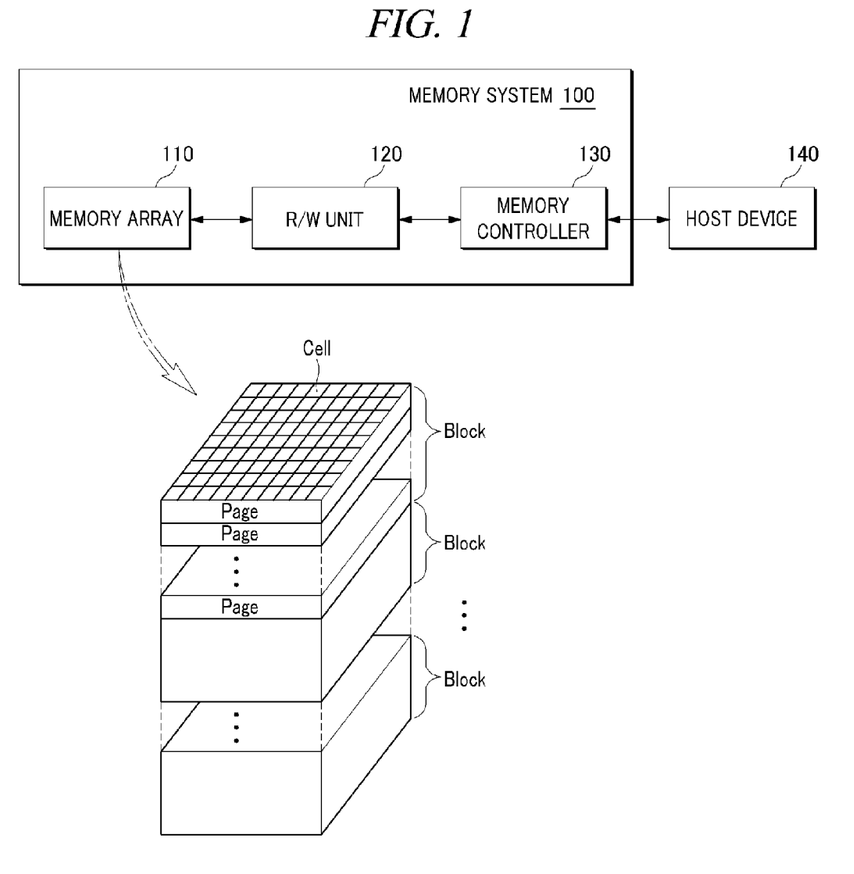
FIG. 1 schematically shows a block diagram of an illustrative example memory system.

FIG. 1 schematically shows a block diagram of an illustrative example memory system 100, arranged in accordance with at least some embodiments described herein.

As depicted, memory system 100 may include a memory array 110, a read/write (R/W) unit 120, and a memory controller 130. A host device 140 may be dynamically configured to interact with memory controller 130 to store data in memory array 110 and/or retrieve data from memory array 110 via R/W unit 120. Although illustrated as discrete components, various components may be divided into additional components, combined into fewer components, or eliminated while being contemplated within the scope of the disclosed subject matter.

Memory array 110 may be organized as multiple memory blocks, each of the memory blocks may be organized as multiple memory pages, and each of the memory pages may be organized as multiple memory cells. The memory cells in each memory page may undergo reading and writing operations at substantially the same time (e.g., simultaneous read/write operations or overlapping read/write operations). Also, the memory cells in each memory block may undergo an erasing operation at substantially the same time (e.g., simultaneous erase operations, or erase operations that are overlapping in time). By way of example, but not limitation, in cases where memory system 100 is a 2-gigabit NAND flash memory device, memory system 100 may have 2048 memory blocks, with 64 memory pages per memory block, and each memory page may have 2112 bytes, consisting of a 2048-byte data area and a 64-byte spare area which may be used for error correction, wear-leveling, and other software overhead functions.

R/W unit 120 may be configured to serve as an interface between memory array 110 and memory controller 130, effective to facilitate write operations and/or read operations. In some example write operations, R/W unit 120 may be configured to receive encoded digital values from memory controller 130, convert the digital values to analog values, and write the analog values into at least one of the memory cells of memory array 110 by applying corresponding voltage levels to gates of the memory cells. In some example read operations, R/W unit 120 may be configured to read analog values out of the memory cells of memory array 110, take digital samples of the analog values, and send the digital samples to memory controller 130, so that memory controller 130 may decode the digital samples based on predetermined read threshold voltages.

Memory controller 130 may be configured to manage and/or control operations of memory system 100. It will be understood by those skilled in the art that each function and/or operation of memory controller 130 may be implemented, individually and/or collectively, by a wide range of hardware, software, firmware, or virtually any combination thereof.

In some embodiments, memory controller 130 may be configured to manage and/or control reading and writing operations of memory system 100 in cooperation with host device 140. That is, memory controller 130 may be configured to receive data to be stored from host device 140, and/or send data retrieved from memory system 100 to host device 140.

In some embodiments, memory controller 130 may be configured to encode data to be written into memory array 110, and/or decode the digital samples received from memory array 110 via R/W unit 120. Memory controller 130 may also be configured to manage and/or control erasure of each memory block and/or invalidation of each memory page.

In some embodiments, memory controller 130 may be configured to dynamically change the read threshold voltages to be used to decode the digital samples. In some embodiments, memory controller 130 may be configured to determine one or more memory pages to be analyzed, identify the read threshold voltages of each memory cell of each memory page, and perform statistical analysis on the identified read threshold voltages to determine a distribution of read threshold voltages. Then, memory controller 130 may be configured to perform a decoding operation based at least in part on the determined distribution of read threshold voltages.

In some embodiments, memory controller 130 may be configured to identify each memory page to be analyzed at a predetermined time interval. In some other embodiments, memory controller 130 may be configured to identify each memory page to be analyzed after each memory page is invalidated. In yet some other embodiments, memory controller 130 may be configured to identify each memory page to be analyzed when the memory block that includes the corresponding memory page is to be erased. In still some other embodiments, memory controller 130 may be configured to identify each memory page to be analyzed after a predetermined number of accesses.

By way of example, but not limitation, it may be assumed that the host device 140 sends an instruction to the memory controller 130. The instructions may direct to delete data stored in Page K of one of the memory blocks, Block Q, which consists of Pages 1 to N. When memory controller 130 receives the instruction to delete the data stored in Page K, Page K may be invalidated by the memory controller 130, while each of Pages 1 to (K−1) and (K+1) to N may be active until memory controller 130 receives other instructions to delete the corresponding memory pages. Active pages of Block Q may still be accessed until whole pages of Block Q (i.e., Pages 1 to N) are invalidated. Then, when the whole pages of Block Q are invalidated, memory controller 130 may identify respective read counts of Pages 1 to N. Then, memory controller 130 may calculate respective read disturb counts for Pages 1 to N. The read disturb count for Page K may be defined as follows:

$$\text{read distrub count (Page } K) = \sum_{i=1}^{N} \text{read count (Page } i) - \text{read count (Page } K).$$

Then, memory controller 130 may identify read threshold voltages of each memory cell of each of Pages 1 to N, and perform statistical analysis on the identified read threshold voltages with regard to the read disturb counts, to determine the distribution of the read threshold voltages. By way of example, but not limitation, memory controller 130 may be configured to determine a distribution model and at least one associated parameter of the distribution model.

Figure 2A:
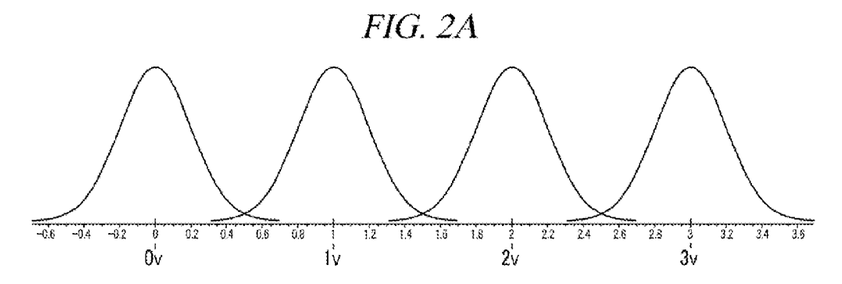
FIGS. 2A-2C schematically show illustrative example distributions of read threshold voltages associated with a memory system.
Figure 2B:
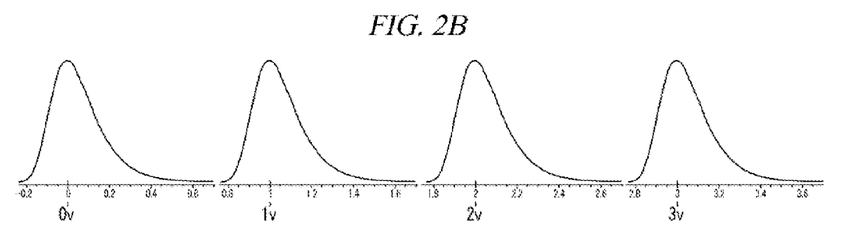
Figure 2C:
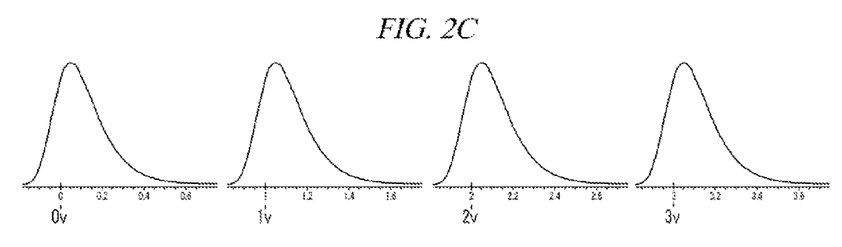

Example results of the statistical analysis are shown in FIGS. 2A-2C. In the example embodiments illustrated in FIGS. 2A-2C, reference voltages for the memory cells of memory array 110 are assumed to be 0V, 1V, 2V and 3V. In each of FIGS. 2A-2C, the horizontal axis indicates voltage in volts (V), and the graph indicates the distribution of the read threshold voltages.

By way of example, but not limitation, for the pages with the read disturb counts that have a value less than 100, memory controller 130 may evaluate the distribution of the read threshold voltages as a normal distribution as shown in FIG. 2A. The distribution $f1_{(\mu,\sigma)}(x)$ may be expressed as follows:

$$f1_{(\mu,\sigma)}(x) = \frac{\exp\left(-\frac{1}{2}\left(\frac{x-\mu}{\sigma}\right)^2\right)}{\sigma\sqrt{2\pi}},$$

where μ (mean) corresponds to the respective reference voltages (i.e., 0V, 1V, 2V and 3V), and σ (standard deviation) corresponds to 0.2V.

By way of example, but not limitation, for the pages with the read disturb counts have a value in the range between 100 and 10,000, memory controller 130 may evaluate the distribution of the read threshold voltages as a Gumbel distribution as shown in FIG. 2B. The distribution $f2_{(\mu,\sigma)}(x)$ may be expressed as follows:

$$f2_{(\mu,\sigma)}(x) = \frac{1}{\sigma}\exp\left(-\left(\frac{x-\mu}{\sigma}\right) - \exp\left(-\left(\frac{x-\mu}{\sigma}\right)\right)\right),$$

where μ corresponds to the respective reference voltages (i.e., 0V, 1V, 2V and 3V), and σ corresponds to 0.1V.

By way of example, but not limitation, for the pages with the read disturb counts have a value greater than 10,000, memory controller 130 may evaluate the distribution of the read threshold voltages also as a Gumbel distribution as shown in FIG. 2C. In such cases, μ corresponds to voltages higher than the respective reference voltages by 0.05V (i.e., 0.05V, 1.05V, 2.05V and 3.05V), and σ corresponds to 0.1V. As shown, the distribution of the read threshold voltages may become asymmetric, as the read disturb count increases.

Although the distribution of the read threshold voltages is illustrated as a Gumbel distribution in FIGS. 2B-2C, those skilled in the art will recognize that any type of asymmetric distribution may be available to depict the distribution of the read threshold voltages.

Referring back to FIG. 1, in some embodiments, memory system 100 may be configured to store the identified read threshold voltages of each memory cell and the read disturb count calculated for the memory page including the corresponding memory cell, and/or the determined distribution of the read threshold voltages in a predetermined memory portion of memory system 100. By way of example, but not limitation, the predetermined memory portion of memory system 100 may be a portion of the memory block including the corresponding memory cell, a portion of the memory blocks different from the memory block including the corresponding memory cell, or a random access memory (not shown) that may be optionally incorporated in memory system 100, depending on the desired implementation.

In some embodiments, memory controller 130 may be configured to decode data written on at least one memory page of memory array 110 based at least in part on the determined distribution of read threshold voltages. By way of example, but not limitation, it may be assumed that host device 140 sends memory controller 130 an instruction to retrieve data stored in memory cells of Page J of Block R, which also which consists of N pages. In such cases, memory controller 130 may be configured to calculate a target read disturb count for Page J, as follows:

$$\text{target read distrub count (Page } J) = \sum_{i=1}^{N} \text{read count (Page } i) - \text{read count (Page } J)$$

That is, memory controller 130 may be configured to calculate the target read disturb count for Page J of Block R by calculating a sum of read counts of all other pages in Block R than Page J.

Then, memory controller 130 may determine a target distribution of the read threshold voltages that may be associated with the target read disturb count.

By way of example, but not limitation, when memory controller 130 calculates the target read disturb count for Page J as 50, memory controller 130 may determine the target distribution of the read threshold voltages as $f1_{(\mu,\sigma)}(x)$ with μ=0V, 1V, 2V or 3V, and σ=0.2V, as illustrated in FIG. 2A. In such cases, memory controller 130 may decode the data written on the memory cells of Page J using the target distribution of the read threshold voltages of $f1_{(\mu,\sigma)}(x)$ with μ=0V, 1V, 2V or 3V, and σ=0.2V. For instance, when using a hard decision error correction code (ECC) decoding scheme, memory controller 130 may decode the data written on the memory cells of Page J, as in Table 1 below.

TABLE 1

| Read threshold voltage | Result of decoding |
| --- | --- |
| ~0.5 V | data corresponding to 0 V |
| 0.5 V~1.5 V | data corresponding to 1 V |
| 1.5 V~2.5 V | data corresponding to 2 V |
| 2.5 V~ | data corresponding to 3 V |

The values 0.5V, 1.5V, and 2.5V indicated in the left column of Table 1 above may be respectively determined as the values satisfying $f1_{(\mu=0,\sigma=0.2)}(x)=f1_{(\mu=1,\sigma=0.2)}(x)$, $f1_{(\mu=1,\sigma=0.2)}(x)=f1_{(\mu=2,\sigma=0.2)}(x)$, and $f1_{(\mu=2,\sigma=0.2)}(x)=f1_{(\mu=3,\sigma=0.2)}(x)$.

By way of another example, but not limitation, when memory controller 130 calculates the target read disturb count for Page J with a value of 5,000, memory controller 130 may determine the target distribution of the read threshold voltages as $f2_{(\mu,\sigma)}(x)$ with μ=0V, with μ=0V, 1V, 2V or 3V, and σ=0.1V, as illustrated in FIG. 2B. In such cases, memory controller 130 may decode the data written on the memory cells of Page J using the target distribution of the read threshold voltages of $f2_{(\mu,\sigma)}(x)$ with μ=0V, 1V, 2V or 3V, and σ=0.1V. For instance, when using a hard decision ECC decoding scheme, memory controller 130 may decode the data written on the memory cells of Page J, as in Table 2 below.

TABLE 2

| Read threshold voltage | Result of decoding |
| --- | --- |
| ~0.77 V | data corresponding to 0 V |
| 0.77 V~1.77 V | data corresponding to 1 V |
| 1.77 V~2.77 V | data corresponding to 2 V |
| 2.77 V~ | data corresponding to 3 V |

The values 0.77V, 1.77V, and 2.77V indicated in the left column of Table 2 above are respectively determined as the values satisfying $f2_{(\mu=0,\sigma=0.1)}(x)=f2_{(\mu=1,\sigma=0.1)}(x)$, $f2_{(\mu=1,\sigma=0.1)}(x)=f2_{(\mu=2,\sigma=0.1)}(x)$, and $f2_{(\mu=2,\sigma=0.1)}(x)=f2_{(\mu=3,\sigma=0.1)}(x)$.

By way of yet another example, but not limitation, when memory controller 130 calculates the target read disturb count for Page J with a value of 20,000, memory controller 130 may determine the target distribution of the read threshold voltages as $f2_{(\mu,\sigma)}(x)$ with μ=0.05V, 1.05V, 2.05V or 3.05V, and ν=0.1V, as illustrated in FIG. 2C. In such cases, memory controller 130 may decode the data written on the memory cells of Page J using the target distribution of the read threshold voltages of $f2_{(\mu,\sigma)}(x)$ with μ=0.05V, 1.05V, 2.05V or 3.05V, and ν=0.1V. For instance, when using a soft decision ECC decoding scheme, memory controller 130 may decode the data written on the memory cells of Page J using log-likelihood ratio (LLR) values may be calculated as follows:

$$LLR_{Vref=0v} = \log\left(\frac{f2_{(\mu=0.05,\sigma=0.1)}(V_{thd})}{f2_{(\mu=1.05,\sigma=0.1)}(V_{thd}) + f2_{(\mu=2.05,\sigma=0.1)}(V_{thd}) + f2_{(\mu=3.05,\sigma=0.1)}(V_{thd})}\right)$$

$$LLR_{Vref=1v} = \log\left(\frac{f2_{(\mu=1.05,\sigma=0.1)}(V_{thd})}{f2_{(\mu=0.05,\sigma=0.1)}(V_{thd}) + f2_{(\mu=3.05,\sigma=0.1)}(V_{thd}) + f2_{(\mu=3.05,\sigma=0.1)}(V_{thd})}\right)$$

$$LLR_{Vref=2v} = \log\left(\frac{f2_{(\mu=2.05,\sigma=0.1)}(V_{thd})}{f2_{(\mu=0.05,\sigma=0.1)}(V_{thd}) + f2_{(\mu=1.05,\sigma=0.1)}(V_{thd}) + f2_{(\mu=3.05,\sigma=0.1)}(V_{thd})}\right)$$

$$LLR_{Vref=3v} = \log\left(\frac{f2_{(\mu=3.05,\sigma=0.1)}(V_{thd})}{f2_{(\mu=0.05,\sigma=0.1)}(V_{thd}) + f2_{(\mu=1.05,\sigma=0.1)}(V_{thd}) + f2_{(\mu=3.05,\sigma=0.1)}(V_{thd})}\right),$$

where $V_{ref}$ refers to the reference voltage and $V_{thd}$ refers to the read threshold voltage.

Figure 3:
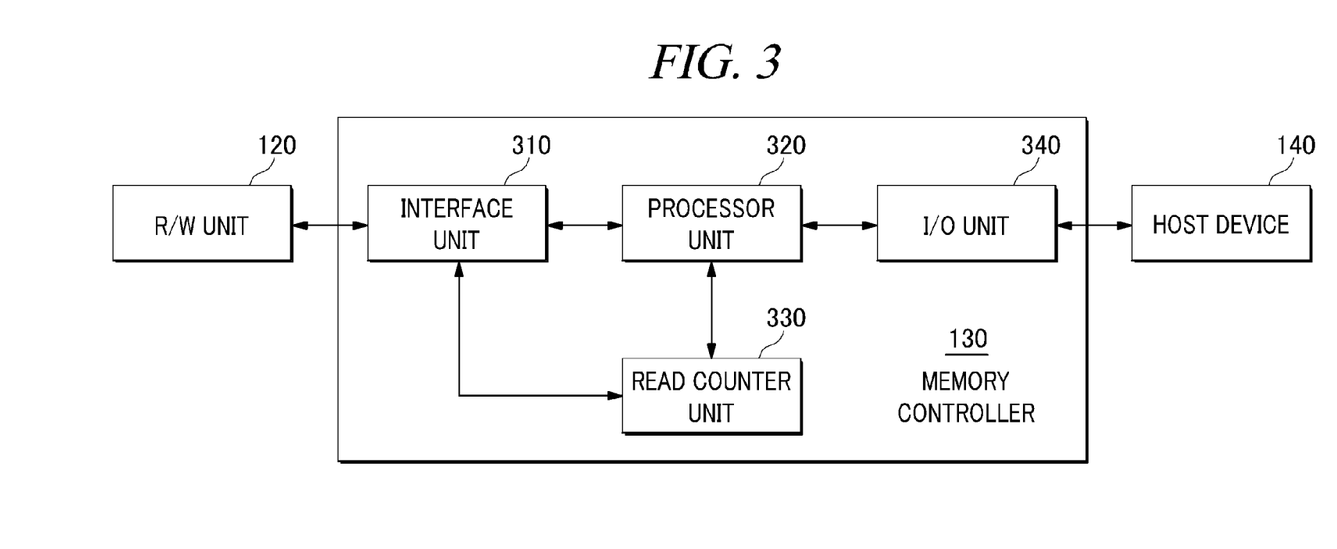
FIG. 3 schematically shows a block diagram of an illustrative example memory controller.

FIG. 3 schematically shows a block diagram of an illustrative example memory controller 130, arranged in accordance with at least some embodiments described herein.

As depicted, memory controller 130 may include an interface unit 310, a processor unit 320, a read counter unit 330 and an input/output (I/O) unit 340. Although illustrated as discrete components, various components may be divided into additional components, combined into fewer components, or eliminated while being contemplated within the scope of the disclosed subject matter. It will be understood by those skilled in the art that each function and/or operation of the components may be implemented, individually and/or collectively, by a wide range of hardware, software, firmware, or virtually any combination thereof.

Interface unit 310 may be configured to communicate with R/W unit 120. That is, interface unit 310 may facilitate transfer of data between processor unit 320 and R/W unit 120.

Processor unit 320 may be configured to perform operations for storing data in memory array 110 and/or retrieving data from memory array 110. In some embodiments, processor unit 320 may be configured to encode data to be written into memory array 110, and/or decode digital samples that may be received from memory array 110 via R/W unit 120 and interface unit 310.

In some embodiments, processor unit 320 may also be configured to dynamically change read threshold voltages to be used for decoding the digital samples. Processor unit 320 may determine one or more memory pages to be analyzed, identify the read threshold voltages of each memory cell of each memory page, and perform statistical analysis on the identified read threshold voltages to determine a distribution of read threshold voltages.

Read counter unit 330 may be configured to identify read counts of the memory pages. In some embodiments, processor unit 320 may calculate respective read disturb counts for the respective memory pages, based on the read counts identified by read counter unit 330. Then, processor unit 320 may determine the distribution of read threshold voltages, with reference to the calculated read disturb counts. Further, in some embodiments, processor unit 320 may also calculate a target read disturb count based on the read counts identified by read counter unit 330, to determine a target distribution of the read threshold voltages to be used for decoding data written on a given memory page of memory array 110.

I/O unit 340 may be configured to facilitate communicate with host device 140. In some embodiments, I/O unit 340 may be configured to receive data to be stored from host device 140, and/or send data retrieved from memory array 110 to host device 140.

As such, by using statistics on read threshold voltages associated with read disturb counts, more accurate decision threshold may be used in hard decision ECC decoding, and more accurate LLR values may be used in soft decision ECC decoding, so that ECC performance may be improved. Also in iterative decoding such as low-density parity-check (LDPC) decoding, it may be expected to reduce amount of iteration for error correction, thereby reducing overall power consumption. Also, life expectancy of the memory system may be enhanced, since frequency of transferring/writing data in a new page for read disturb management may be reduced.

Figure 4:
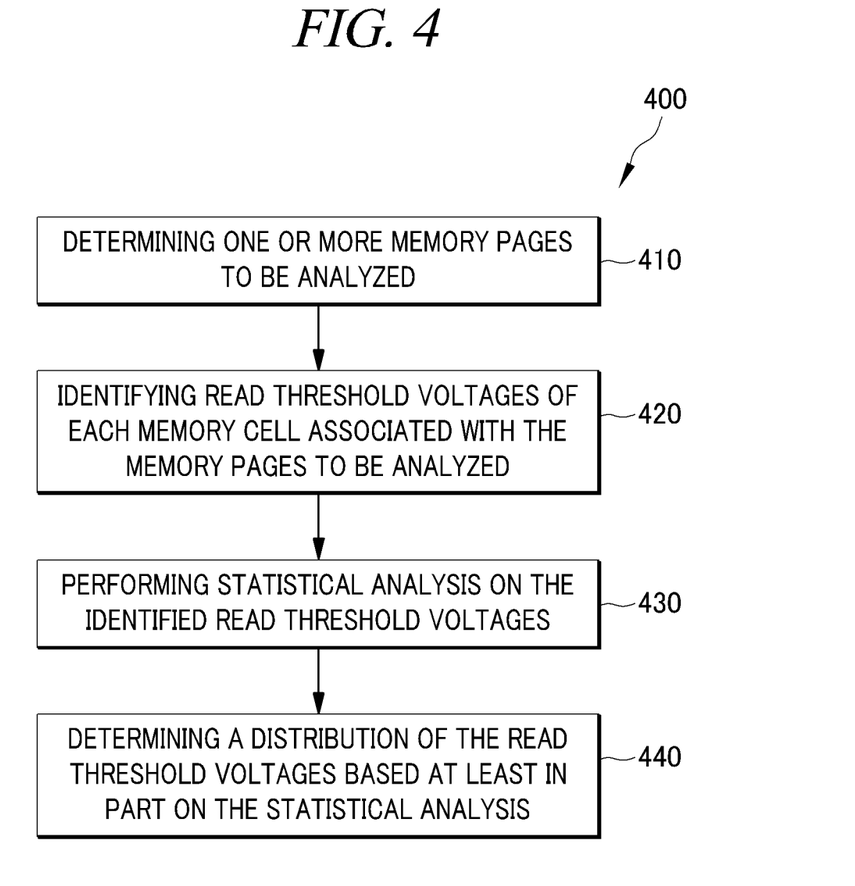
FIG. 4 schematically shows an example flow diagram of a method for controlling a memory system.

FIG. 4 schematically shows an example flow diagram of a method 400 for controlling a memory system, arranged in accordance with at least some embodiments described herein.

Method 400 may be implemented in a memory system such as memory system 100 including memory array 110, R/W unit 120 and memory controller 130, or a memory controller such as memory controller 130 including interface unit 310, processor unit 320, read counter unit 330 and I/O unit 340. Method 400 may include one or more operations, actions, or functions as illustrated by one or more of blocks 410, 420, 430 and/or 440. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 400 may begin at block 410, "DETERMINING ONE OR MORE MEMORY PAGES TO BE ANALYZED."

At block 410, the memory system or the memory controller may be adapted to determine one or more memory pages to be analyzed. In some embodiments, the memory system or the memory controller may identify each memory page to be analyzed at a predetermined time interval. In some other embodiments, the memory system or the memory controller may identify each memory page to be analyzed after each memory page is invalidated. In yet some other embodiments, the memory system or the memory controller may identify each memory page to be analyzed when the memory block that includes the corresponding memory page is to be erased. In still some other embodiments, the memory system or the memory controller may identify each memory page to be analyzed after a predetermined number of accesses. Block 410 may be followed by block 420, "IDENTIFYING READ THRESHOLD VOLTAGES OF EACH MEMORY CELL ASSOCIATED WITH THE MEMORY PAGES TO BE ANALYZED."

At block 420, the memory system or the memory controller may be adapted to identify read threshold voltages of each memory cell associated with the memory pages to be analyzed. Block 420 may be followed by block 430, "PERFORMING STATISTICAL ANALYSIS ON THE IDENTIFIED READ THRESHOLD VOLTAGES."

At block 430, the memory system or the memory controller may be adapted to perform statistical analysis on the identified read threshold voltages. In some embodiments, the memory system or the memory controller may calculate read disturb counts for respective memory pages to be analyzed, and statistically analyze the identified read threshold voltages associated with the read disturb counts. Block 430 may be followed by block 440, "DETERMINING A DISTRIBUTION OF THE READ THRESHOLD VOLTAGES BASED AT LEAST IN PART ON THE STATISTICAL ANALYSIS."

At block 440, the memory system or the memory controller may be adapted to determine a distribution of the read threshold voltages (e.g., a distribution model and at least one associated parameter of the distribution model) based at least in part on the statistical analysis. In some embodiments, the distribution of the read threshold voltages may vary depending on the read disturb count. The determined distribution of the read threshold voltages may be used for decoding data written on at least one memory page of the memory system.

Figure 5:
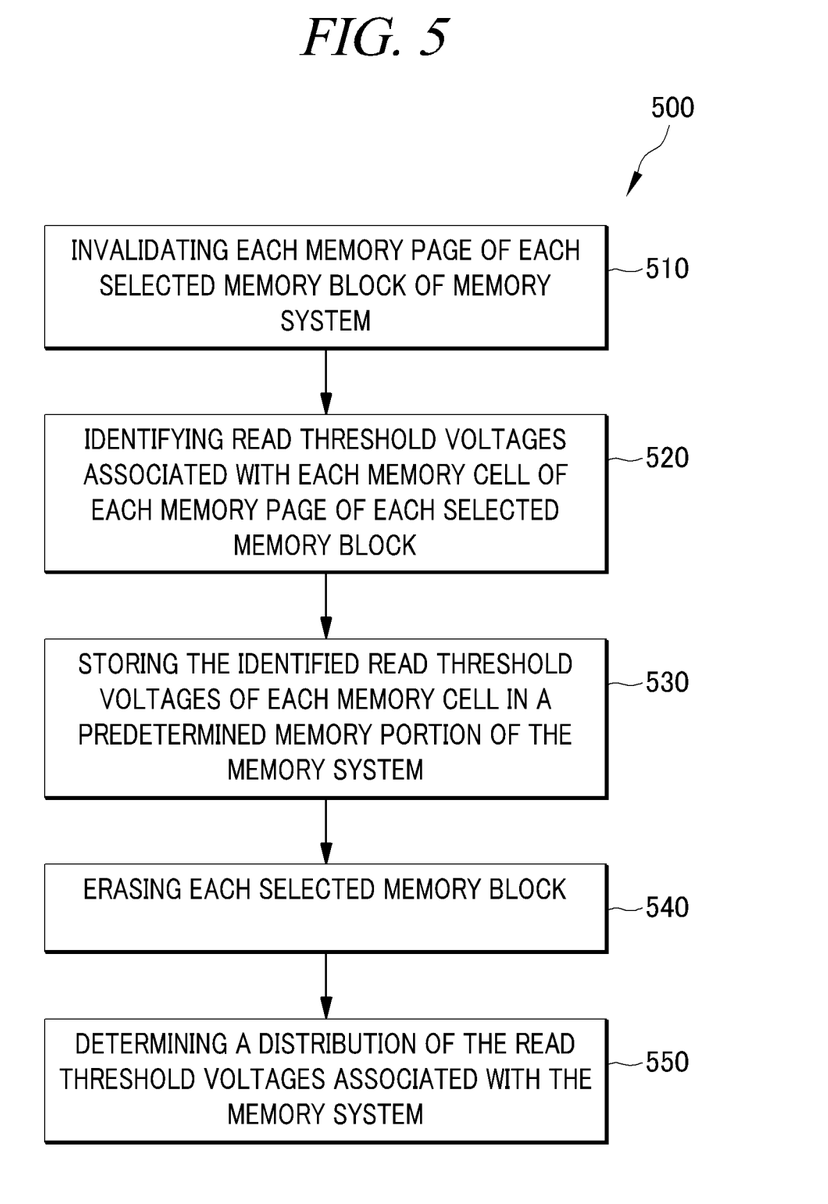
FIG. 5 schematically shows another example flow diagram of a method for controlling a memory system, all arranged in accordance with at least some embodiments described herein.

FIG. 5 schematically shows another example flow diagram of a method 500 for controlling a memory system, arranged in accordance with at least some embodiments described herein.

Method 500 may be implemented in a memory system such as memory system 100 including memory array 110, R/W unit 120 and memory controller 130, or a memory controller such as memory controller 130 including interface unit 310, processor unit 320, read counter unit 330 and I/O unit 340. Method 500 may include one or more operations, actions, or functions as illustrated by one or more of blocks 510, 520, 530, 540 and/or 550. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 500 may begin at block 510, "INVALIDATING EACH MEMORY PAGE OF EACH SELECTED MEMORY BLOCK OF MEMORY SYSTEM."

At block 510, the memory system or the memory controller may be adapted to invalidate each memory page of each selected memory block of the memory system. Block 510 may be followed by block 520, "IDENTIFYING READ THRESHOLD VOLTAGES ASSOCIATED WITH EACH MEMORY CELL OF EACH MEMORY PAGE OF EACH SELECTED MEMORY BLOCK."

At block 520, the memory system or the memory controller may be adapted to identify read threshold voltages associated with each memory cell of each memory page of each selected memory block. Block 520 may be followed by block 530, "STORING THE IDENTIFIED READ THRESHOLD VOLTAGES OF EACH MEMORY CELL IN A PREDETERMINED MEMORY PORTION OF THE MEMORY SYSTEM."

At block 530, the memory system or the memory controller may be adapted to store the identified read threshold voltages of each memory cell in a predetermined memory portion of the memory system. By way of example, but not limitation, the predetermined memory portion of the memory system may be a portion of the memory block including the corresponding memory cell, a portion of the memory blocks different from the memory block including the corresponding memory cell, or a random access memory that may be optionally incorporated in the memory system, depending on the desired implementation. Block 530 may be followed by block 540, "ERASING EACH SELECTED MEMORY BLOCK."

At block 540, the memory system or the memory controller may be adapted to erase each selected memory block. Block 540 may be followed by block 550, "DETERMINING A DISTRIBUTION OF THE READ THRESHOLD VOLTAGES ASSOCIATED WITH THE MEMORY SYSTEM."

At block 550, the memory system or the memory controller may be adapted to determine a distribution of the read threshold voltages associated with the memory system, which may be used to decode data written on at least one memory page of the memory system. In some embodiments, the memory system or the memory controller may calculate a read disturb count for each memory page of each selected memory block, and statistically analyze the identified read threshold voltages associated with the read disturb counts.

One skilled in the art will appreciate that, for these and other methods disclosed herein, the functions performed in the methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected," or "operably coupled," to each other to achieve the desired functionality, and any two components capable of being so associated may also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," and the like include the number recited and refer to ranges which may be subsequently broken down into subranges as discussed above. Finally, as will be understood by one skilled in the art, a range includes each individual member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method to control a memory system that includes memory blocks, wherein each memory block has memory pages, and each memory page has memory cells, the method to control the memory system comprising:
   determining one or more memory pages to be analyzed;
   identifying read threshold voltages of each memory cell associated with the determined one or more memory pages to be analyzed;
   calculating a read disturb count for a respective one of the determined one or more memory pages, wherein the identified read threshold voltages are associated with the read disturb count;

performing statistical analysis on the identified read threshold voltages associated with the read disturb count;

determining a distribution of the identified read threshold voltages associated with the read disturb count based, at least in part, on the statistical analysis; and decoding data written on at least one memory page of the memory system based, at least in part, on the determined distribution of the identified read threshold voltages.

2. The method of claim 1, wherein the determining the one or more memory pages to be analyzed is performed at a specific time interval, after each memory page is invalidated, when the memory block that includes the memory pages is to be erased, or after a specific number of accesses.

3. The method of claim 1, wherein the determining the distribution of the identified read threshold voltages comprises determining a distribution model and at least one associated parameter of the distribution model.

4. The method of claim 1, wherein the calculating the read disturb count for the respective one of the determined one or more memory pages comprises calculating a sum of read counts of other memory pages associated with a memory block that includes the respective one of the determined one or more memory pages.

5. A method to control a memory system that includes memory blocks, wherein each memory block has memory pages, and each memory page has memory cells, the method to control the memory system comprising:

determining one or more memory pages to be analyzed;

identifying read threshold voltages of each memory cell associated with the determined one or more memory pages to be analyzed;

calculating a read disturb count for a respective one of the determined one or more memory pages, wherein the identified read threshold voltages are associated with the read disturb count;

performing statistical analysis on the identified read threshold voltages associated with the read disturb count;

determining a distribution of the identified read threshold voltages associated with the read disturb count based, at least in part, on the statistical analysis, wherein the calculating the read disturb count for the respective one of the determined one or more memory pages comprises calculating a sum of read counts of other memory pages associated with a memory block that includes the respective one of the determined one or more memory pages;

reading data that is written on one of the memory pages of the memory system;

calculating a target read disturb count for the memory page on which the data is written, as a sum of read counts of other memory pages associated with a memory block that includes the memory page on which the data is written;

determining a target distribution of the identified read threshold voltages that are associated with the target read disturb count; and decoding the data based, at least in part, on the determined target distribution.

6. A method to control a memory system that includes memory blocks, wherein each memory block has memory pages, and each memory page has memory cells, the method to control the memory system comprising:

determining one or more memory pages to be analyzed;

identifying read threshold voltages of each memory cell associated with the determined one or more memory pages to be analyzed;

calculating a read disturb count for a respective one of the determined one or more memory pages, wherein the identified read threshold voltages are associated with the read disturb count;

performing statistical analysis on the identified read threshold voltages associated with the read disturb count; and determining a distribution of the identified read threshold voltages associated with the read disturb count based, at least in part, on the statistical analysis, wherein the determining the distribution of the identified read threshold voltages comprises varying the distribution of the identified read threshold voltages depending on the read disturb count, and wherein the calculating the read disturb count for the respective one of the determined one or more memory pages comprises calculating a sum of read counts of other memory pages associated with a memory block that includes the respective one of the memory pages.

7. The method of claim 6, wherein the varying the distribution of the identified read threshold voltages comprises modifying the distribution of the identified read threshold voltages to be asymmetric as the read disturb count increases.

8. A memory system, comprising:

a plurality of memory blocks, wherein each memory block includes memory pages, and each memory page includes memory cells; and a memory controller coupled to the plurality of memory blocks, wherein the memory controller is configured to:

identify one or more memory blocks to be erased;

identify read threshold voltages of each memory cell of each memory page of each identified memory block;

calculate a read disturb count for each memory page of each identified memory block, wherein the identified read threshold voltages are associated with the read disturb count;

perform statistical analysis on the identified read threshold voltages associated with the read disturb count;

determine a distribution of the identified read threshold voltages associated with the read disturb count based at least in part on the statistical analysis; and decode data stored in the plurality of memory blocks based at least in part on the determined distribution of the identified read threshold voltages.

9. The memory system of claim 8, wherein the memory controller is configured to:

calculate the read disturb count for each memory page of each identified memory block as a sum of read counts of other memory pages of a memory block that includes each memory page.

10. The memory system of claim 8, wherein the memory system includes a solid-state drive (SSD).

11. The memory system of claim 9, wherein the memory controller is configured to:

read data that is written on one of the memory pages of the memory system;

calculate a target read disturb count for the memory page on which the data is written, as a sum of read counts of other memory pages associated with a memory block that includes the memory page on which the data is written;

determine a target distribution of the identified read threshold voltages that is associated with the target read disturb count; and decode the data based, at least in part, on the determined target distribution.

12. The memory system of claim 9, wherein to determine the distribution of the identified read threshold voltages, the memory controller is configured to vary the distribution of the identified read threshold voltages depending on the read disturb count.

13. The memory system of claim 12, wherein to vary the distribution of the identified read threshold voltages, the memory controller is configured to modify the distribution of the identified read threshold voltages to be asymmetric as the read disturb count increases.

* * * * *

UNITED STATES PATENT AND TRADEMARK OFFICE
CERTIFICATE OF CORRECTION

PATENT NO. : 9,747,993 B2  
APPLICATION NO. : 14/908340  
DATED : August 29, 2017  
INVENTOR(S) : Lee Page 1 of 1

It is certified that error appears in the above-identified patent and that said Letters Patent is hereby corrected as shown below:

In the Specification

In Column 7, Line 31, delete "V=0.1V," and insert -- σ=0.1V, --, therefor.

In Column 7, Line 35, delete "V=0.1V." and insert -- σ=0.1V. --, therefor.

In the Claims

In Column 14, Lines 46-47, in Claim 8, delete "based at least in part" and insert -- based, at least in part, --, therefor.

In Column 14, Line 49, in Claim 8, delete "based at least in part" and insert -- based, at least in part, --, therefor.

Signed and Sealed this  
Fifteenth Day of May, 2018

Andrei Iancu  
*Director of the United States Patent and Trademark Office*